(12) United States Patent
Ferrante et al.

(10) Patent No.: US 10,818,456 B2
(45) Date of Patent: Oct. 27, 2020

(54) MULTI-FUNCTION KEY SYSTEM

(71) Applicant: Delta Systems, Inc., Streetsboro, OH (US)

(72) Inventors: Robert Louis Ferrante, Stow, OH (US); Raymond P. Kawolics, Jr., Macedonia, OH (US); Michelle R. Specht, Mantua, OH (US)

(73) Assignee: Delta Systems, Inc., Streetsboro, OH (US)

( * ) Notice: Subject to any disclaimer, the term of this patent is extended or adjusted under 35 U.S.C. 154(b) by 267 days.

(21) Appl. No.: 16/050,647

(22) Filed: Jul. 31, 2018

(65) Prior Publication Data
US 2019/0043682 A1 Feb. 7, 2019

Related U.S. Application Data

(60) Provisional application No. 62/539,711, filed on Aug. 1, 2017.

(51) Int. Cl.
H01H 36/00 (2006.01)
F02P 1/08 (2006.01)
G01R 33/07 (2006.01)
H01H 27/00 (2006.01)

(52) U.S. Cl.
CPC .......... H01H 36/0013 (2013.01); F02P 1/08 (2013.01); G01R 33/072 (2013.01); H01H 36/004 (2013.01); H01H 27/00 (2013.01); H01H 2231/026 (2013.01); H01H 2239/024 (2013.01); H01H 2239/05 (2013.01); H01H 2300/038 (2013.01)

(58) Field of Classification Search
CPC .. H01H 36/0013; H01H 36/004; H01H 27/00; H01H 2231/026; H01H 2239/024; H01H 2239/05; H01H 2300/038; F02P 1/08; G01R 33/072
See application file for complete search history.

(56) References Cited

U.S. PATENT DOCUMENTS 3,305,805 A * 2/1967 Tann ................... H03K 17/95
335/153
4,453,148 A * 6/1984 Norakidze ........... H01H 36/004
335/205

(Continued)

Primary Examiner — Mohamad A Musleh
(74) Attorney, Agent, or Firm — Tarolli, Sundheim, Covell & Tummino LLP; John A. Yirga, Esq.

(57) ABSTRACT

A multi-function key system and method is provided that includes key identification system, a first key, and a second key. The multi-function key system is in communication with an item of power equipment, and comprises first and second sensors for detecting magnetic fields. The first key is configured to interact with the key identification system, the first key comprises a first magnet generating a first magnetic field. The second key is configured to interact with the key identification system. The second key comprises a second magnet generating a second magnetic field. Wherein the first and second sensors differentiate between the first and second key based upon the first and second magnetic fields. The key identification system initiates a first functionality of the power equipment responsive to identifying the first key, and initiates a second functionality of the power equipment responsive to identifying the second key.

20 Claims, 14 Drawing Sheets

(56) References Cited

U.S. PATENT DOCUMENTS

| | | | | |
|---|---|---|---|---|
| 4,737,751 A | * | 4/1988 | Risk | H01H 36/0013 335/205 |
| 4,758,819 A | * | 7/1988 | Kuribayashi | H01H 36/008 340/286.08 |
| 7,520,264 B2 | | 4/2009 | Straka | |
| 7,629,543 B2 | | 12/2009 | Kahnert | |

* cited by examiner

MULTI-FUNCTION KEY SYSTEM

CROSS REFERENCES TO RELATED APPLICATIONS

The following application claims priority to U.S. Provisional Patent Application Ser. No. 62/539,711 filed Aug. 1, 2017 entitled MULTI-FUNCTION KEY SYSTEM. The above-identified application is incorporated herein by reference in its entirety for all purposes.

FIELD OF THIS DISCLOSURE

The present disclosure relates to a multi-function key system and method of operation and more specifically, relates to a system that has alternative functionalities depending on a function associated with a specific key.

BACKGROUND

A key typically engages a device, including automobiles recreational vehicles, commercial vehicles, ignition circuits, lawn mowers, garden tractors, and the like, hereinafter "power equipment". The key alerts an internal system of the device that the key is present, which indicates an authorized user is operating the power equipment. The key being detected will send a signal to a controller that the key is in place, which in turn renders a push-button starter or switch actuatable. Once actuated, the starter will initiate a single function of the power equipment (e.g., start an engine).

Further discussion relating to how various power equipment operates or has operations initiated can be found in U.S. Pat. No. 7,629,543 entitled SWITCH ASSEMBLY HAVING A MECHANICALLY ACTUATED OVERRIDE that issued on Dec. 8, 2009 and assigned to the assignee of the present disclosure and U.S. Pat. No. 7,520,264 entitled IGNITION CIRCUIT that issued on Apr. 21, 2009. Both U.S. Pat. Nos. 7,629,543 and 7,520,264 are incorporated herein by reference in their entirety.

SUMMARY

One aspect of the present disclosure includes a multi-function key system and method that includes key identification system, a first key, and a second key. The multi-function key system is in communication with an item of power equipment, and comprises first and second sensors for detecting magnetic fields. The first key is configured to interact with the key identification system, the first key comprises a first magnet generating a first magnetic field. The second key is configured to interact with the key identification system. The second key comprises a second magnet generating a second magnetic field. Wherein the first and second sensors differentiate between the first and second key based upon the first and second magnetic fields. The key identification system initiates a first functionality of the power equipment responsive to identifying the first key, and initiates a second functionality of the power equipment responsive to identifying the second key.

BRIEF DESCRIPTION OF THE SEVERAL VIEWS OF THE DRAWINGS

The foregoing and other features and advantages of the present disclosure will become apparent to one skilled in the art to which the present disclosure relates upon consideration of the following description of the disclosure with reference to the accompanying drawings, wherein like reference numerals, unless otherwise described refer to like parts throughout the drawings and in which.

Figure 1:
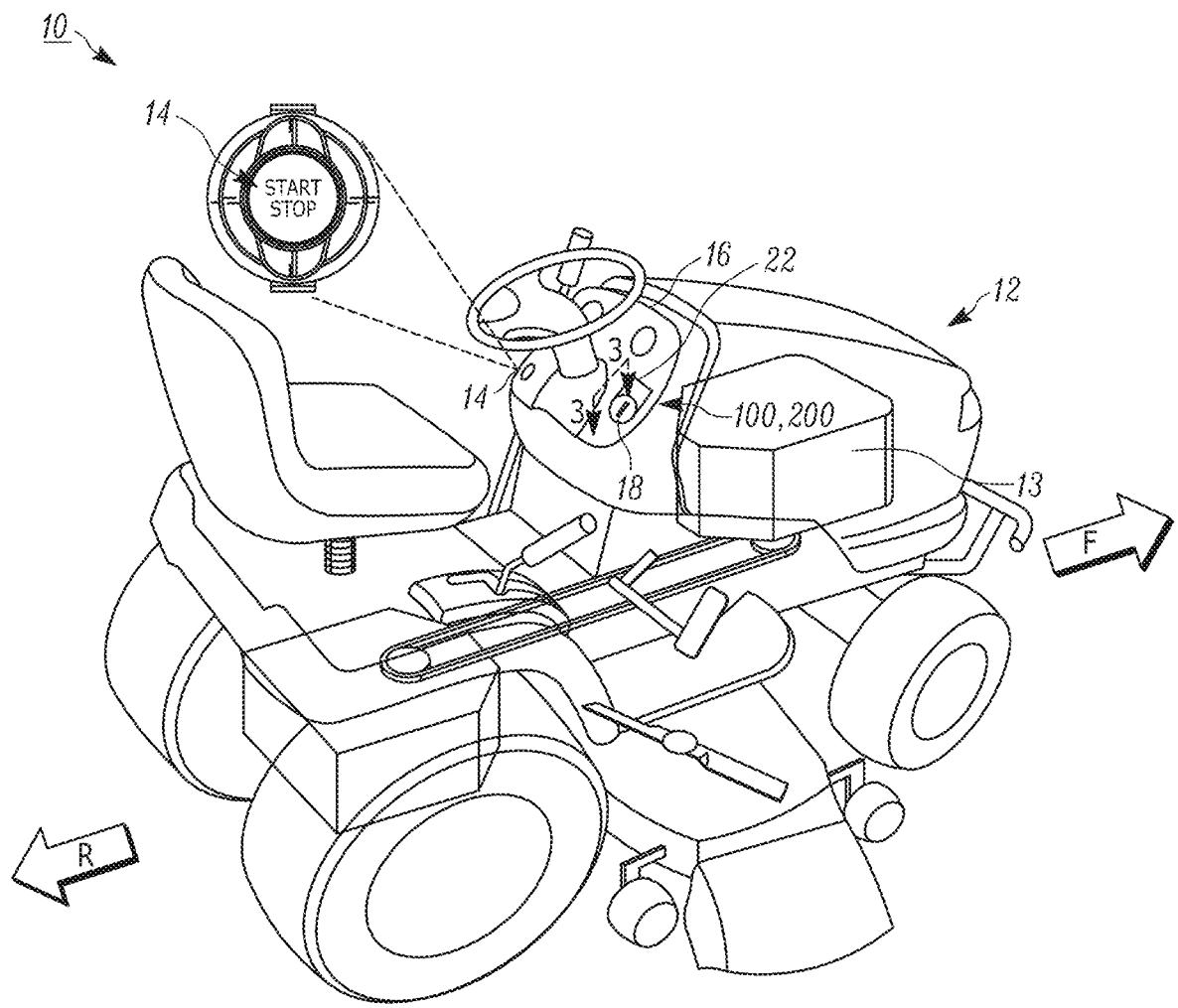
FIG. 1 illustrates one form of power equipment using a multi-function key system constructed in accordance with one example embodiment of the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

Referring now to the figures generally wherein like numbered features shown therein refer to like elements having similar characteristics and operational properties throughout unless otherwise noted. The present disclosure relates to a multi-function key system and method of operation and more specifically, relates to a system that has alternative functionalities depending on a function associated with a specific key.

FIG. 1 illustrates power equipment 10 in the form of a riding mower. The power equipment 10 employs a multi-function key system 100, 200 constructed in accordance with one or more example embodiments of the present disclosure. It should be appreciated by those skilled in the art, that the power equipment 10 in addition to being a riding mower, could also be lawn and agricultural tractors, snowmobiles, snow blowers, jet skis, boats, all-terrain-vehicles, bulldozers, generators, and the like without departing from the spirit and scope of the present disclosure.

As illustrated in FIG. 1, the multi-function key system 100, 200 is located in a dash 16 of the power equipment 10, although it would be appreciated by one having ordinary skill in the art that the multi-function key system 100, 200 or various components of the multi-function key system can be located in various places in or on items of power equipment. The multi-function key system 100, 200 is illustrated in more detail in FIGS. 2-5. The power equipment 10 comprises the dash 16 having a key hole 18 in communication with the multi-function key system 100, 200, a power indicator 22, and a push start/stop button 14. Additionally, the multi-function key system 100, 200 is in communication with the gas-powered engine or electric motor 13 and power source 12 (such as a battery) of the power equipment.

In a first illustrated example embodiment shown in FIGS. 1-3, the key hole 18 is configured to receive one of a plurality of keys 108, 112 wherein different keys indicate that different functionalities should be activated (discussed in further detail below). The power indicator 22 comprises a visual and/or audio indicator that the power equipment 10 has been powered and can be started by actuating the push button 14. In one example embodiment, the power indicator 22 has audio and/or visual indicators that are specific to a functionality indicated by the specific key 108, 112, inserted into the keyhole 18. In the illustrated example embodiment, the push button 14 is a depressible button, but could equally be a toggle switch, capacitive touch surface, and the like. Wherein responsive to the power equipment 10 having been started (e.g., the engine 13 is running) actuating/depressing the push button 14 stops the engine and responsive to the power equipment 10 not having been started (e.g., the engine is not running) actuating/depressing the push button starts the engine and/or power-take-off ("PTO") shaft, such as a lawn mower blade.

Figure 2:
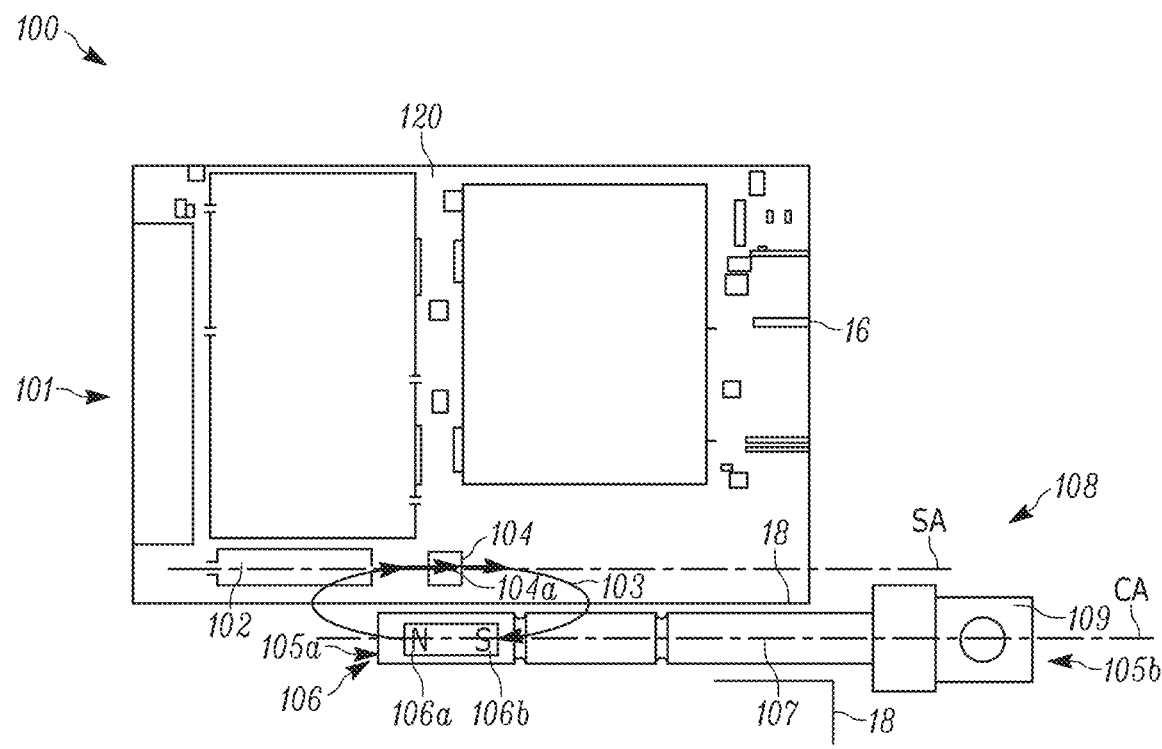
FIG. 2 is a electro-mechanical layout of an example embodiment of a first key and first key system.
Figure 3:
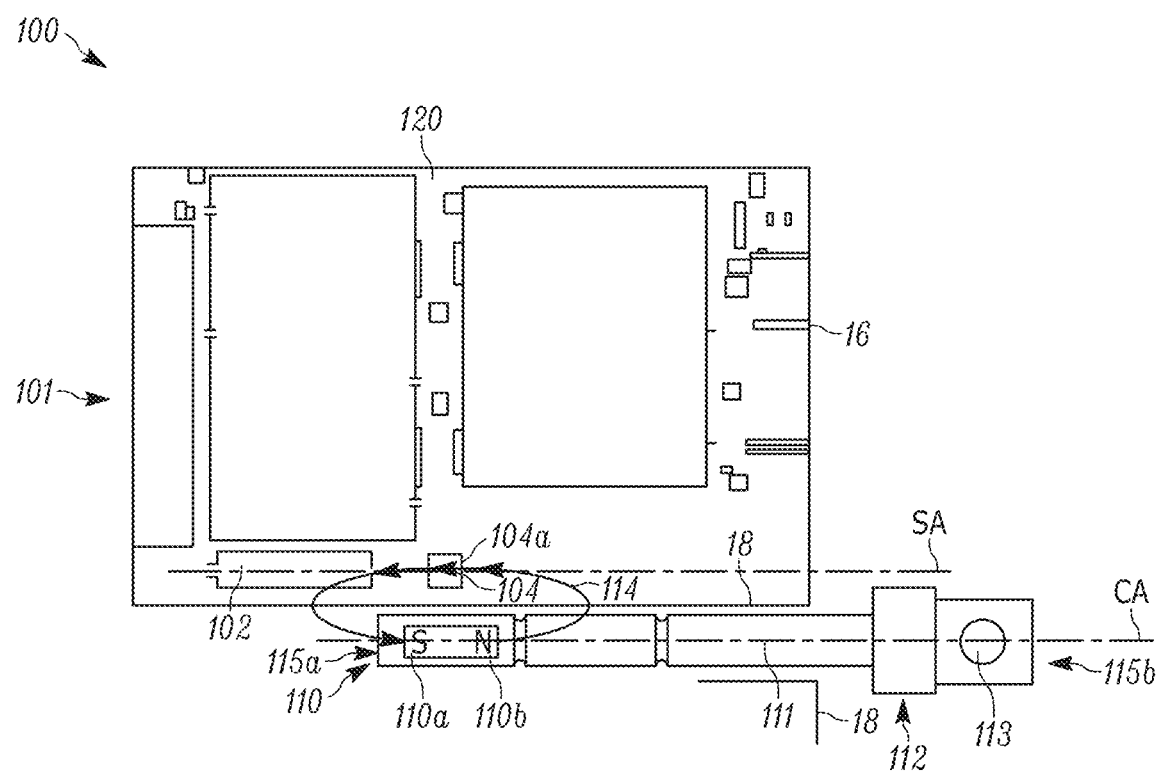
FIG. 3 is an electro-mechanical layout of an example embodiment of a second key and first key system.

Illustrated in FIGS. 2-3 is a first example embodiment of a multi-function key system 100, wherein a first or second key 108, 112, respectively, is inserted into the key hole 18. The key hole 18 houses a first key identification system 101. The first key identification system 101 comprises a first sensor 102 (e.g., a magnetic reed switch), a second sensor 104 (e.g., a Hall Effect sensor, a magneto resistive sensor, a mechanical sensor, etc.), and a control board 120, such as a printed circuit board embedded within electrical circuits and/or components, that controls multiple functions of the power equipment 10. The first and/or second sensor 102, 104 detect magnetic fields near as they approach the sensors. The control board 120 comprises one of memory, a circuit board, a processor, a transceiver, and/or the like in instructional communication with the power equipment 10. In one example embodiment, the control board 120 communicates with the power source 12, and instructs the power source when to power various elements of the power equipment 10, such as powering the push button 14.

In the illustrated embodiment of FIG. 2, a first key 108 comprises a first magnet 106 coupled to a first end 105a of the body 107 of the first key. In the illustrated example embodiment, the body 107 couples the first magnet to a handle 109 of the first key 108, wherein the handle is located at a second end 105b of the first key. The first magnet 106 comprises a north pole 106a nearest the first end 105a and a south pole 106b spaced by the north pole from the first end. In the illustrated embodiment, the poles are co-axial with each other, and co-axial with the body 107 of the first key 108 about a central axis CA of the body 107. In another example embodiment, the poles 106a, 106b, are co-axial to each other, while the body 107 comprises various shapes.

In FIG. 2, magnetic lines 103 of flux flowing from the north pole 106a to the south pole 106b of the first magnet 106 are shown interacting with the first and second sensors 102, 104. In the illustrated example embodiment, the second sensor 104 comprises an arrow 104a indicating a desired direction of flux flow through the second sensor. The second sensor 104 is sensitive to flux flows of magnets, while the first sensor 102 is sensitive to the mere presence of a magnetic field. In this example embodiment, the flux flow of the first magnet 106 actuate both the first and second sensors 102, 104. In one example embodiment, the key 108 is configured such that a relative placement of the first magnet 106 on the key causes the magnetic field generated by the first magnet to interact with the first and second sensors 102, 104 responsive to the key 108 being correctly inserted into the key hole 18. Stated another way, the multi-function key system 100 is designed such that the location of the first magnet 106 relative to the first and second sensors 102, 104 is maintained when the key 108 is correctly inserted into the key hole 18. In the illustrated example embodiment, the first and second magnets 106, 110 are co-axial with the body 107, 111 along the common axis and at least one of the first and second sensors 102, 104 extend along a second axis SA, wherein the second axis and the common axis are parallel to each other. In one example embodiment, the key 108 has a stop (not shown) that interacts with the key hole 18 (e.g., comprising a complimentary stop), such that when the correct insertion depth is reached within the key hole 18, the key 108 stops and cannot be inserted further.

In the illustrated embodiment of FIG. 3, a second key 112 comprises a second magnet 110 coupled to a first end 115a of the second key by an body 111. In the illustrated example embodiment, the body 111 couples the second magnet 110 to a second handle 113 of the second key 112. In one example embodiment, the body 107, 111 of the first and second keys 108,112, respectively, are one of cylindrical, rectangular, or the like. In another example embodiment, the body 107, 111 comprise a non-magnetic material, such as plastic, polymer composites, or the like. In one example embodiment, the second key 112 and the first key 108 are substantially the same, except that the orientation of the poles of the first and second magnets 106, 110, respectively, are inverted within the body 107, 111 of the first and second keys, respectively. The second magnet 110 comprises a south pole 110a nearest the first end 115a and a north pole 110b spaced by the south pole from the first end. In the illustrated embodiment, the poles are co-axial with each other about the central axis CA of the body 111, and co-axial with the body of the key 112.

In the illustrated embodiment of FIG. 3, second magnetic lines 114 of flux flowing from the south pole 110a to the north pole 110b of the second magnet 110 are shown interacting with the first and second sensors 102, 104. The second magnetic lines 114 flow in an opposite direction of the magnetic lines 103 of the first key 106 (see FIG. 2). In one example embodiment, the multi-function key system 100 is designed such that the location of the second magnet 110 relative to the first and second sensors 102, 104 is maintained when the second key 112 is correctly inserted into the key hole 18. In this example embodiment, the second magnetic lines 114 of flux flowing from the south pole 110a to the north pole 110b flows in an opposite direction of the arrow 104a, which indicates the desired direction of flux flow through the second sensor 104.

The detected difference of the direction of flux flows, represented by the magnetic lines 103 in a first direction for the first key 108, and the second magnetic lines 114 in a second direction for the second key 112, signals the control board 120 that different functionalities should be enabled. For example, the detected presence of the first key 108 is indicative that full functionality of the power equipment 10 should be enabled, while the detected presence of the second key 112 is indicative that partial functionality of the power equipment 10 should be enabled (e.g., a lower maximum speed). It would be appreciated by one having ordinary skill in the art that the control board can be programmed such that the first key 108 is indicative a partial functionality and the second key 112 is indicative of full functionality, or some variation thereof. In another example embodiment, the first magnet 106 of the first key 108 has a first Gauss strength, and the second magnet 110 of the second key 112 as a second Gauss strength, wherein the Gauss strength difference (e.g., such as between a 0.5 mG difference, or a 2.0 mG difference) between the first and second magnets is sufficient for the sensors 102, 104 to differentiate between the first and second key. Additionally, in this example embodiment one or both of the first and second sensors 102, 104 comprise an application specific integrated circuit ("ASIC"), a mechanical sensor, a micro-electro mechanical sensor, reed switches, and/or any combination thereof.

Figure 4:
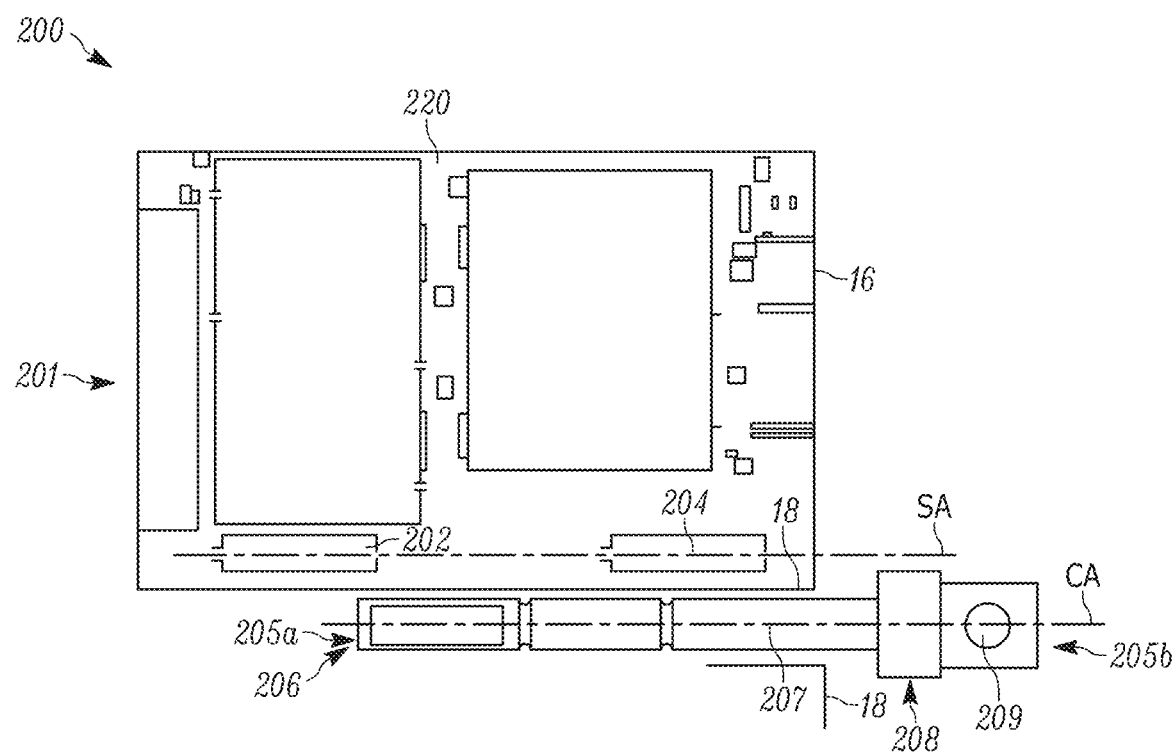
FIG. 4 is an electro-mechanical layout of an example embodiment of a first key and a second key system.
Figure 5:
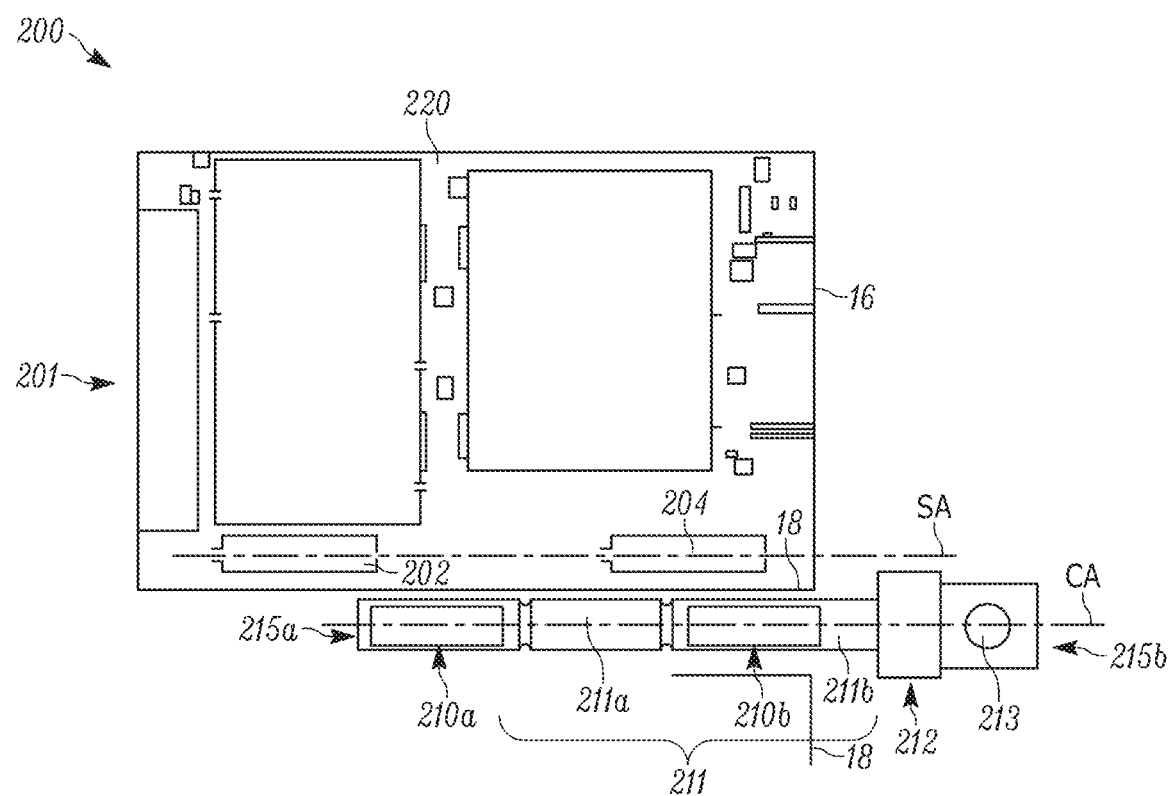
FIG. 5 is an electro-mechanical layout of an example embodiment of a second key and a second key system.

Illustrated in FIGS. 4-5 is a second example embodiment of a multi-function key system 200, wherein a first or second key 208, 212, respectively is inserted into the key hole 18. Features of the multi-function key system 100 illustrated in FIGS. 2-3 that are similar to the features of the multi-function key system 200 illustrated in FIGS. 4-5 will be identified by like numerals increased by a factor of one-hundred.

The key hole 18 houses a second key identification system 201. The second key identification system 201 comprises first and second sensors 202, 204 (e.g., magnetic reed switch, hall effect sensor, other like magnetic sensors, etc.), and a control board 220 that controls multiple functions of the power equipment 10. The first and/or second sensors 202, 204 detect magnetic fields near the sensors upon insertion of the first and second keys 208, 212, respectively. The control board 220 comprises a same or similar structure and function as the control board 120 illustrated in FIGS. 2 and 3.

In the illustrated embodiment of FIG. 4, the first key 208 comprises a magnet 206 coupled to or molded within a first end 205*a* of the body 207 of the first key. The body 207 couples the magnet 206 to a handle 209 of the key 208. The handle 209 is located at a second end 205*b* of the first key 208. The poles of the first magnet 206 can be located in any orientation, so long as a magnetic field generated by the magnet 206 interacts with the first sensor 202. In this embodiment, the body 207 comprises a first length, wherein responsive to the first key 208 being correctly inserted, the body spaces the first magnet 206 from the second sensor 204, such that the magnetic field of the first magnet interacts with the first sensor 202, but not the second sensor, or does not interact with sufficient strength or time to activate the second sensor.

In the illustrated embodiment of FIG. 5, a second key 212 comprises a first magnet 210*a* spaced from a second magnet 210*b* positioned within a body 211 of the second key 212. The first magnet 210*a* is coupled to or molded within a first end 215*a* of the second key 212 by a first portion 211*a* of the body 211. The first portion 211*a* spaces the first magnet 210*a* from the second magnet 210*b*. A second portion 211*b* of the body 211 couples the second magnet 210*b* to a second handle 213 of the second key. In one example embodiment, the second key 212 and the first key 208 are substantially the same, except that the second key has a second magnet 210*b*. The poles of the first and second magnets 110*a*, 110*b* can be located in any orientation, so long as a first magnetic field generated by the first magnet 210*a* interacts with the first sensor 202 and a second magnetic field generated by the second magnet 210*b* interacts with the second sensor 204. In this embodiment, the first portion 211*a* of the body 211 comprises a portion length, wherein responsive to the second key 212 being correctly inserted, the first portion spaces the first magnet 210*a* from the second magnet 210*b*, such that the first magnetic field of the first magnet interacts with and activates the first sensor 202, and the second magnetic field of the second magnet interacts with and activates the second sensor 204. In the illustrated example embodiment, the first and second magnets 206, 210*a*, 210*b* are co-axial with the body 207, 211 along the common axis CA and at least one of the first and second sensors 202, 204 extend along the second axis SA, wherein the second axis and the common axis are parallel to each other. The second sensor 204 is not activated by the first magnet 206, 210*a* passing by the second sensor during insertion of the first or second key 208, 212, respectively, as there is no power being supplied to the start button 14 or the power equipment 10, until the first magnet interacts with the first sensor 102, 202 to instruct power to be provided to the start button and/or the power equipment.

The detection of a magnetic field by solely the first sensor 202 (e.g., when the first key 208 is in the key hole 18) compared to the detection of magnetic fields by both the first and second sensor 202, 204, signals the control board 220 that different functionalities should be enabled. For example, the detected presence of the first key 208 is indicative that a digging, pumping, or low speed function of the power equipment 10 should be enabled, while the detected presence of the second key 212 is indicative that a hoeing, rotational, or high speed function of the power equipment 10 should be enabled.

Figure 6:
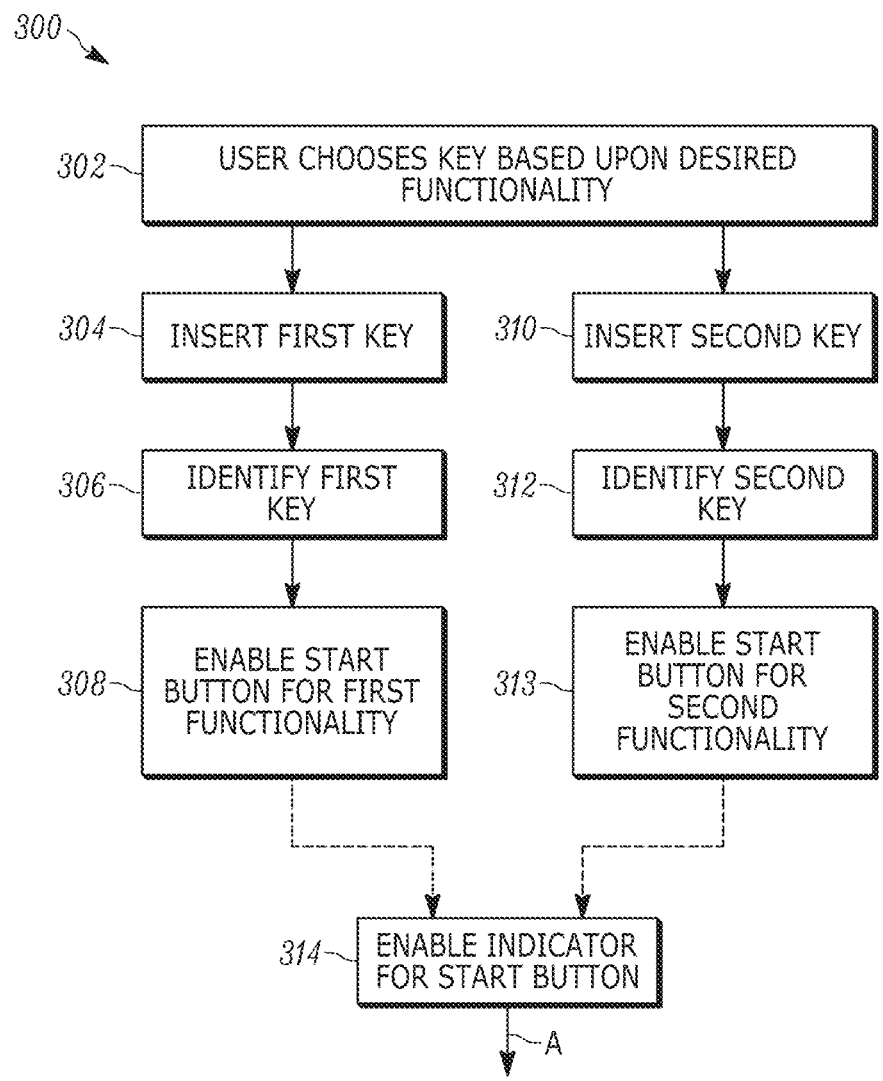
FIG. 6 is a flow chart of a first example method of using the key system.
Figure 7:
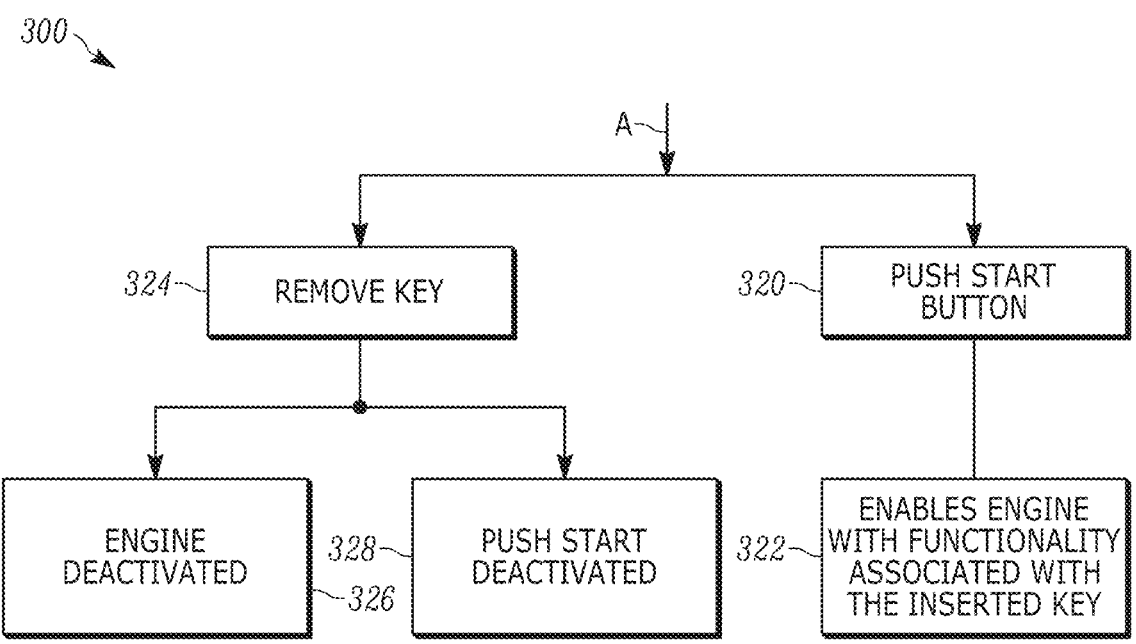
FIG. 7 is a continuation of the first example method of FIG. 6.
Figure 8:
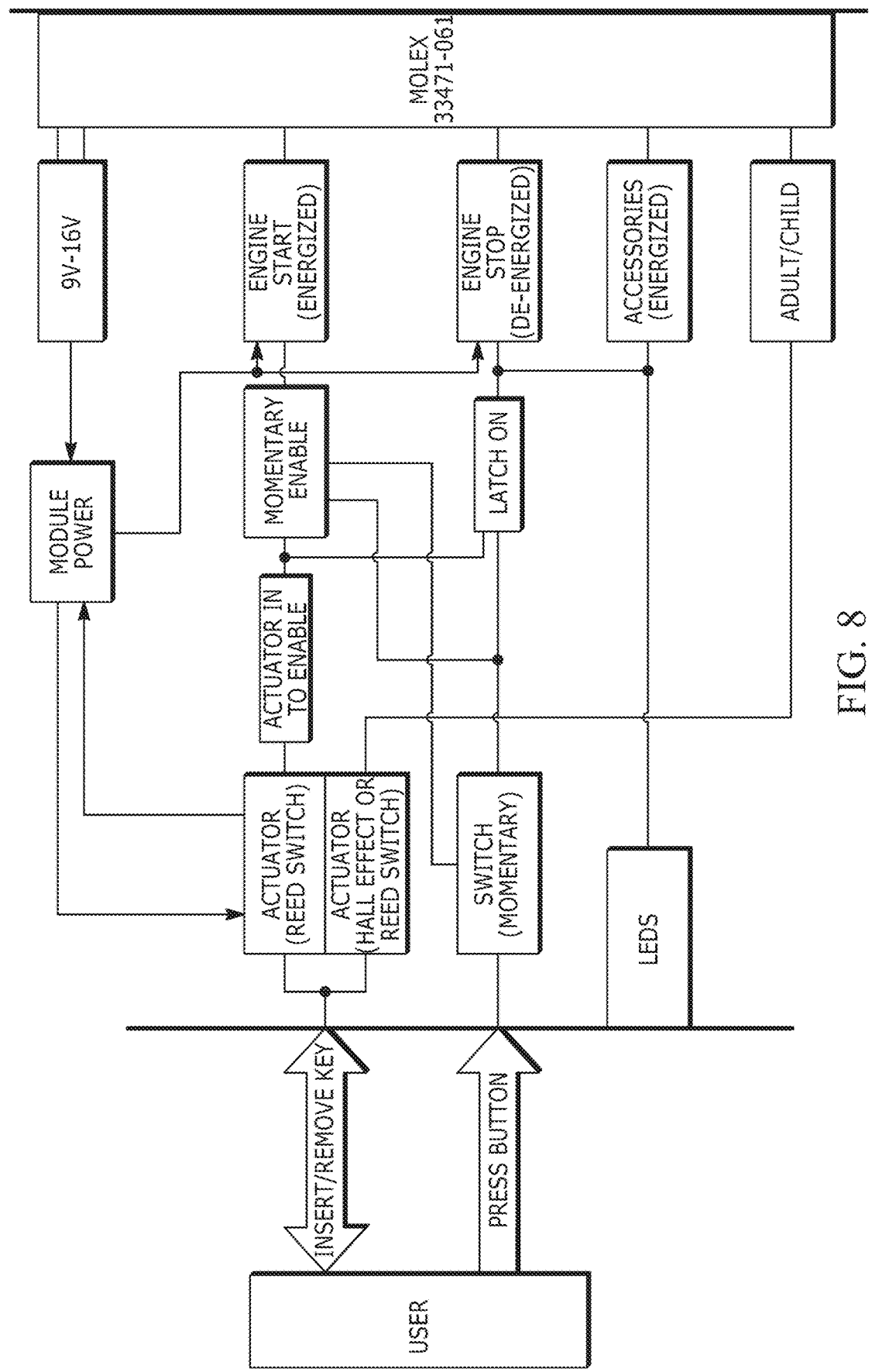
FIG. 8 is a schematic diagram of an example functionality of an item of power equipment.
Figure 9:
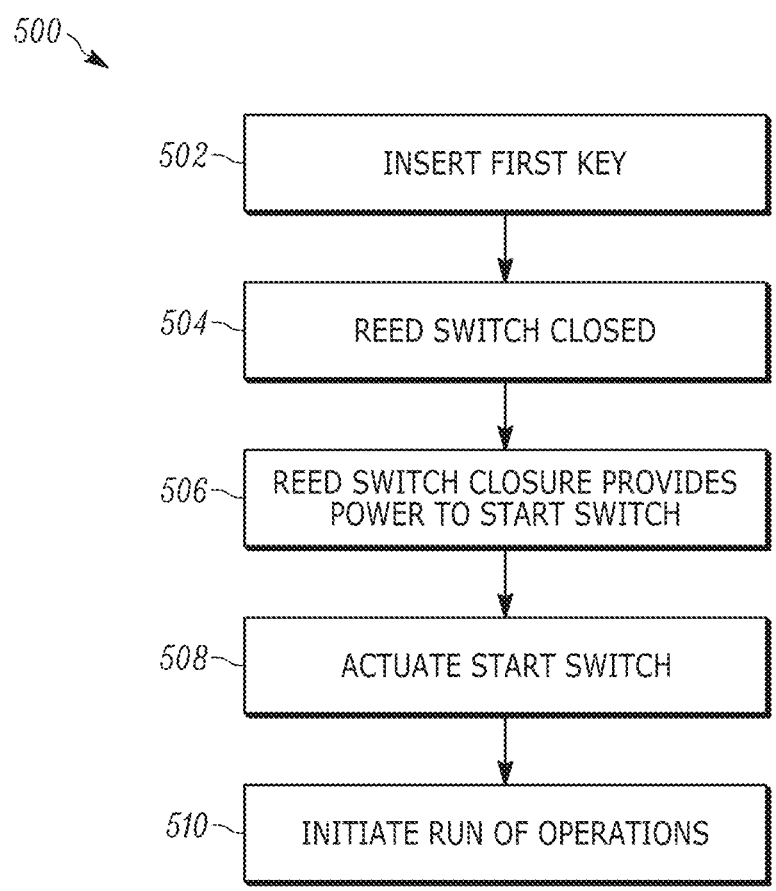
FIG. 9 is a flow chart of a second example method of using a first key in a first key system.

A method 300 of using the multi-function key system 100, 200 is illustrated in FIGS. 6-7. At 302, a user selects a first or second key 108, 208, 112, 212, based upon a desired functionality of the power equipment 10. Such functionality is also, for example, variable speeds (e.g., such as an ability to control a throttle of the engine 13 to limit a speed of the power equipment 10), enabling different systems or controls, PTO operation, hydraulic pumps, cutting blades, back-hoe, fork-lift forks, operable enablement of the power-take-off, any combination thereof, and the like. At 304, the user inserts the first key 108, 208 into the key hole 18. At 306, the key identification system 101, 201 identifies the first key 108, 208. At 308, the key identification system 101, 201 transmits a signal (e.g., via hard-line, WIFI, short-range wireless interconnection, etc.) to enable (e.g., supply power to) the push button 14, wherein the push button is enabled to enable the power equipment 10 to perform a first functionality.

At 314, the indicator 22 is enabled to indicate that the push button 14 is powered. In one example embodiment, the indicator flashes a first color light, or light pattern to indicate that the first functionality has been enabled.

Alternately, responsive to the user desiring to enable the second functionality of the power equipment, the user may select the second key. At 310, the user inserts the second key 112, 212, into the key hole 18. At 312, the key identification system 101, 201 identifies the second key 112, 212. At 313, the key identification system 101, 201 transmits a second signal (e.g., via hard-line, WIFI, short-range wireless interconnection, etc.) to enable (e.g., supply power to) the push button 14, wherein the push button is enabled to enable the power equipment 10 to perform the second functionality. At 314, the indicator 22 is enabled to indicate that the push button 14 is powered. In one example embodiment, the indicator flashes a second color light, or light pattern to indicate that the first functionality has been enabled.

The method 300 of using the multi-function key system 100, 200 is continued in FIG. 7, as illustrated by the line A. At 320, the user actuates the push button 14. At 322, responsive to the user actuating the push button 14 avoiding an open or closed circuit input/output, the engine 13 is enabled with either the first or second functionality, responsive to the identification of the key 108, 208, 112, 212 that was inserted into the key hole 18. At 324, the user removes the key 108, 208, 112, 212. At 326, responsive to the engine 13 being activated, the engine is deactivated by the key 108, 208, 112, 212 removal. At 328, responsive to the engine 13 not having been activated, the push button 14 is powered down by the key 108, 208, 112, 212 removal.

Illustrated in FIGS. 8, 14-16 are example electrical schematics showing component activation paths. In FIGS. 9-10, 14 and 16, a method 500 of using the multi-function key system 100, and an electrical schematic of the multi-function key system is illustrated. At 502, the first key 108, inserted into the key hole, 18 interacts with the reed switch 102. At 504, the reed switch 102 is closed by the magnetic field of the magnet 106. The closure of the reed switch 102 provides power to a start switch 14. At 508, the user actuates the now powered start switch 14. At 510, the actuation of the start switch 14 initiates a run operation 800 (see FIGS. 13 and 16).

Figure 10:
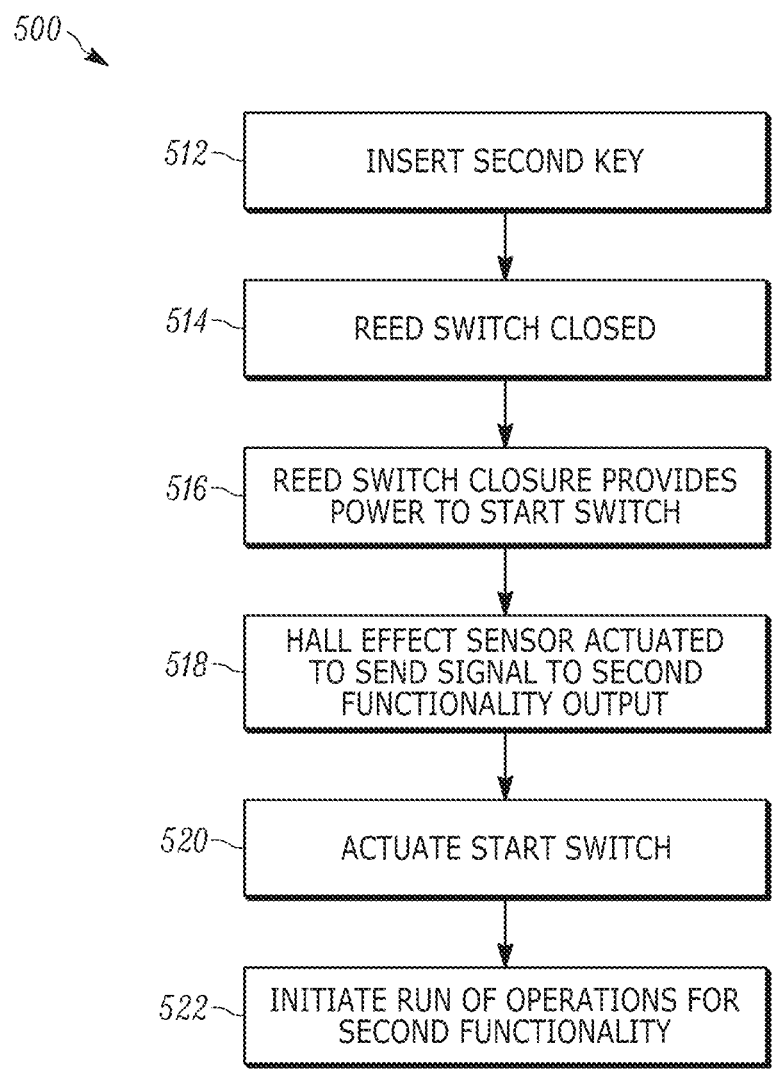
FIG. 10 is a flow chart of a second example method of using a second key in a first key system.
Figure 11:
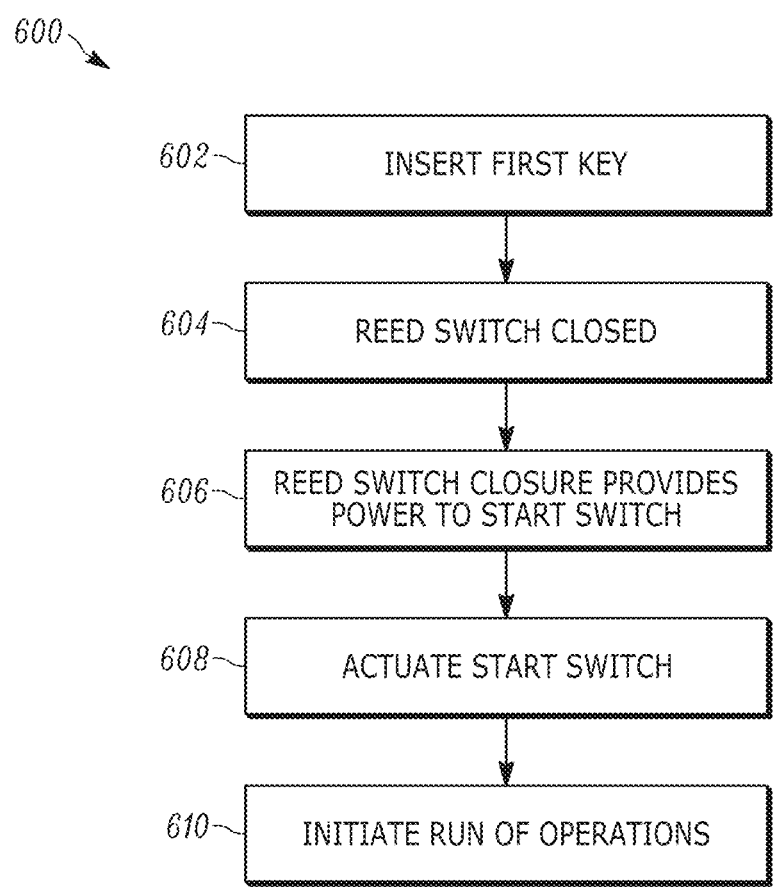
FIG. 11 is a flow chart of a third example method of using a first key in a second key system.

In FIG. 10, the method 500 of using the multi-function key system 100 is continued. At 512, the second key 112 is inserted into the key hole 18 and interacts with the reed switch 102 (see FIG. 14). At 514, the reed switch 102 is closed by interacting with the magnetic field of the magnet 106. At 516, the closure of the reed switch 102 provides power to the start switch 14. At 518, the Hall Effect sensor 104 is actuated to send a signal to a second functionality output. The second functionality output enables the power equipment 10 to perform the second functionality. At 520, the user actuates the now powered start switch 14. At 522, the actuation of the start switch 14 initiates the run operation 800 (see FIGS. 13 and 16).

In FIGS. 11-12, 15, and 16, a method 600 of using the multi-function key system 200, and an electrical schematic of the multi-function key system 200 is illustrated. At 602-610, the method is substantially the same as steps 502-510 as described above with regards to FIG. 9, except the multi-function key system 200 is utilized.

Figure 12:
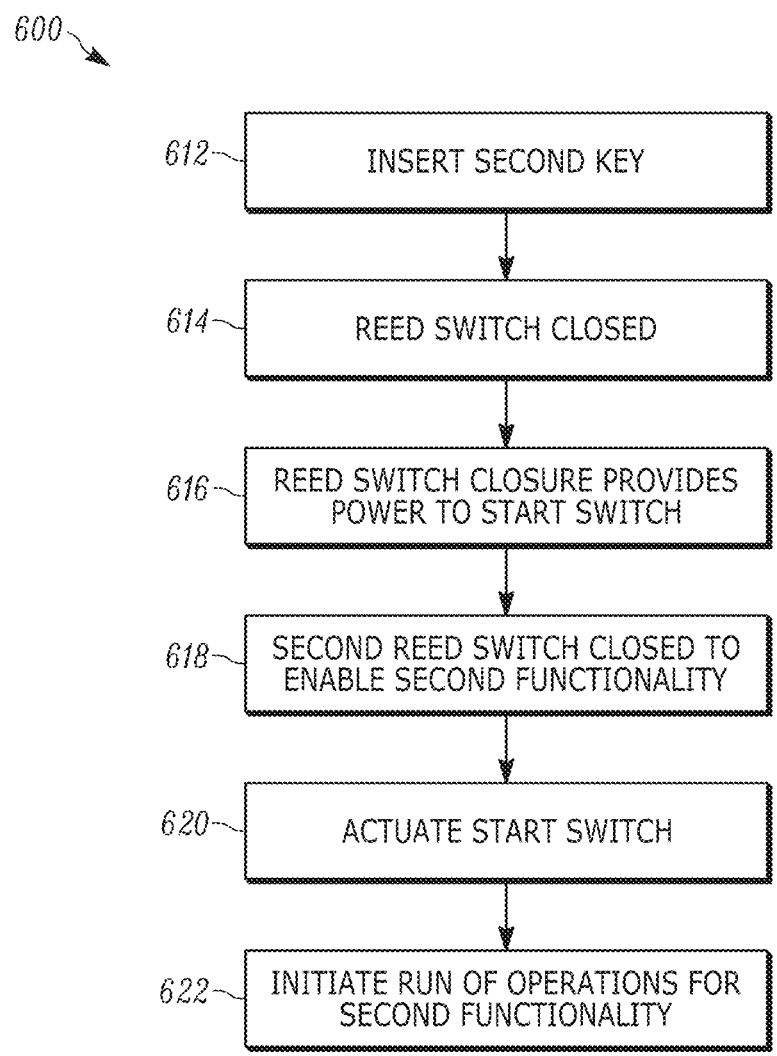
FIG. 12 is a flow chart of a third example method of using a second key in a second key system.

In FIG. 12, the method 600 of using the multi-function key system 200 is continued. At 612, the second key 212 is inserted into the key hole 18 and interacts with the reed switch 102 (see FIG. 15). At 614, the reed switch 202 is closed because of the interaction with the magnetic field of the first magnet 210*a*. At 616, the closure of the reed switch 202 provides power to the start switch 14. At 618, the second reed switch 204 is closed because of the interaction with the magnetic field of the second magnet 210*b*, which sends a signal to a second functionality output. In one example embodiment, the second functionality output is sent to ground. At 620, the user actuates the now powered start switch 14. At 622, the actuation of the start switch 14 initiates the run operation 800 (see FIGS. 13 and 16).

Figure 13:
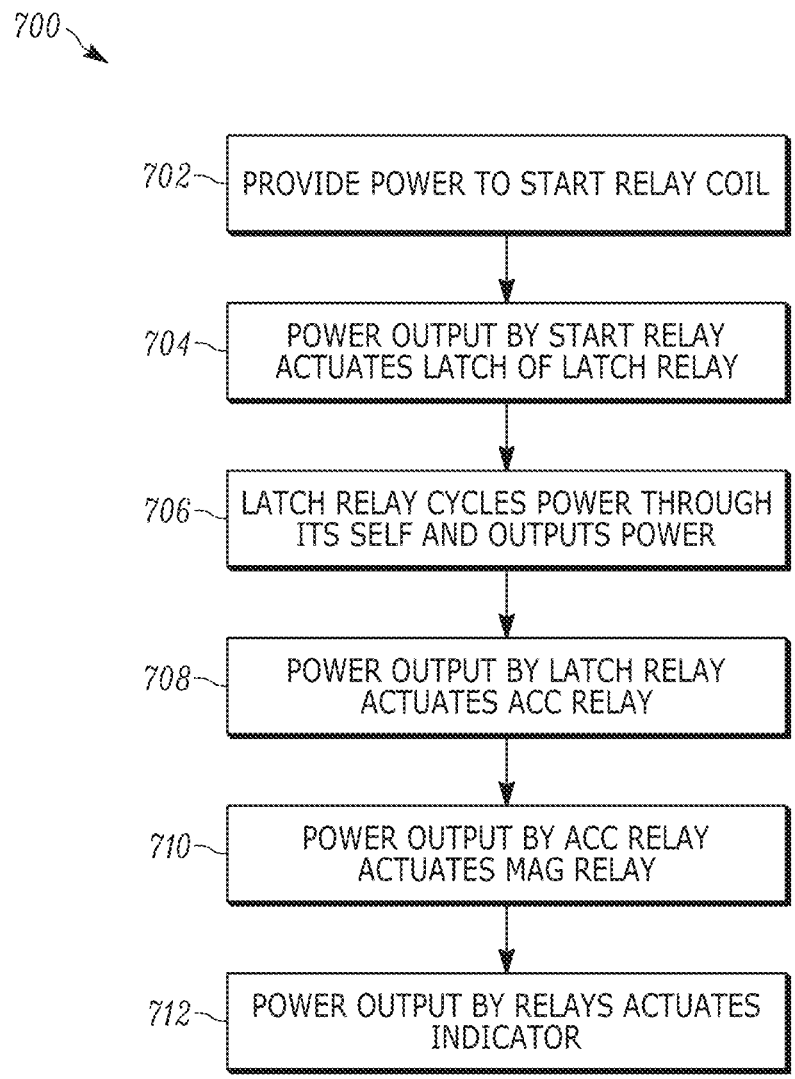
FIG. 13 is a flow chart of an example run operation of the power equipment.
Figure 14:
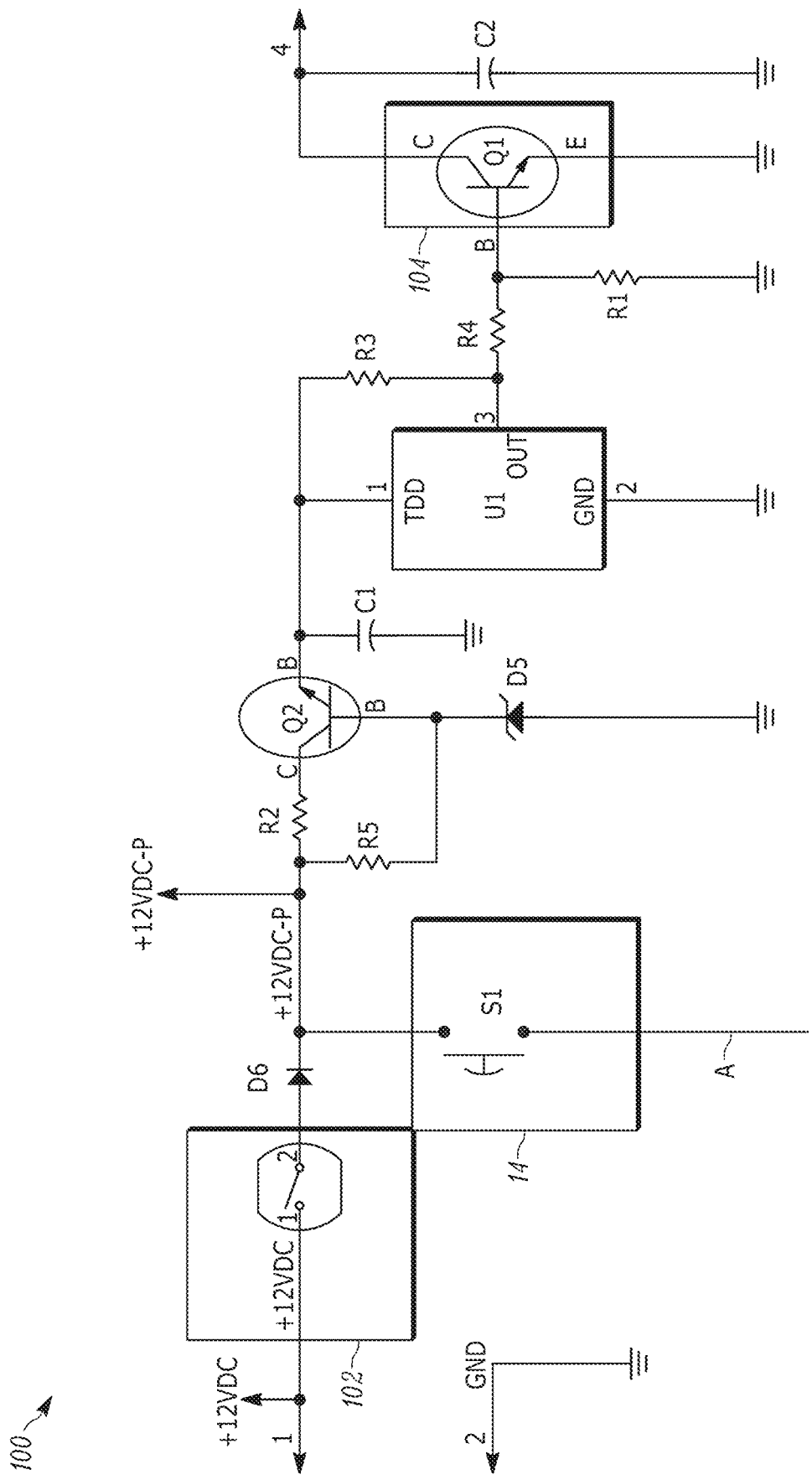
FIG. 14 is an electric schematic diagram of a first key system.
Figure 15:
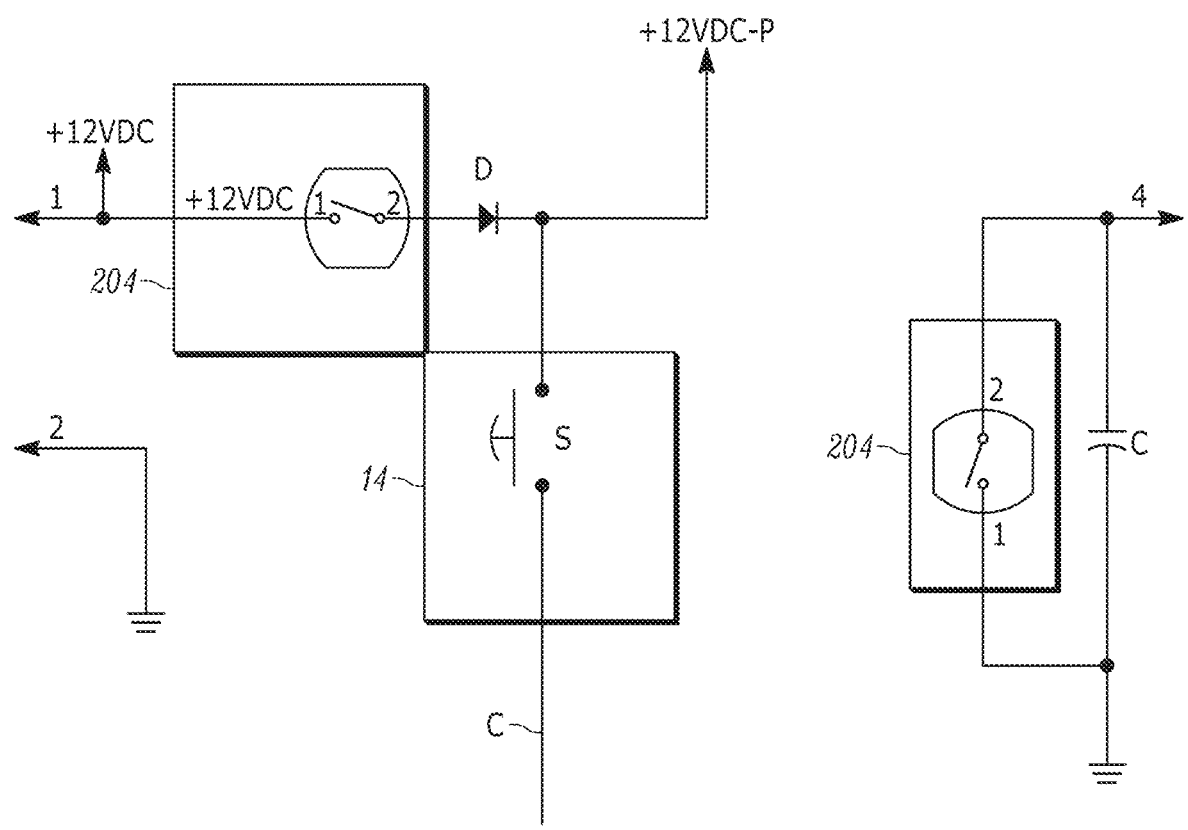
FIG. 15 is an electric schematic diagram of a second key system.
Figure 16:
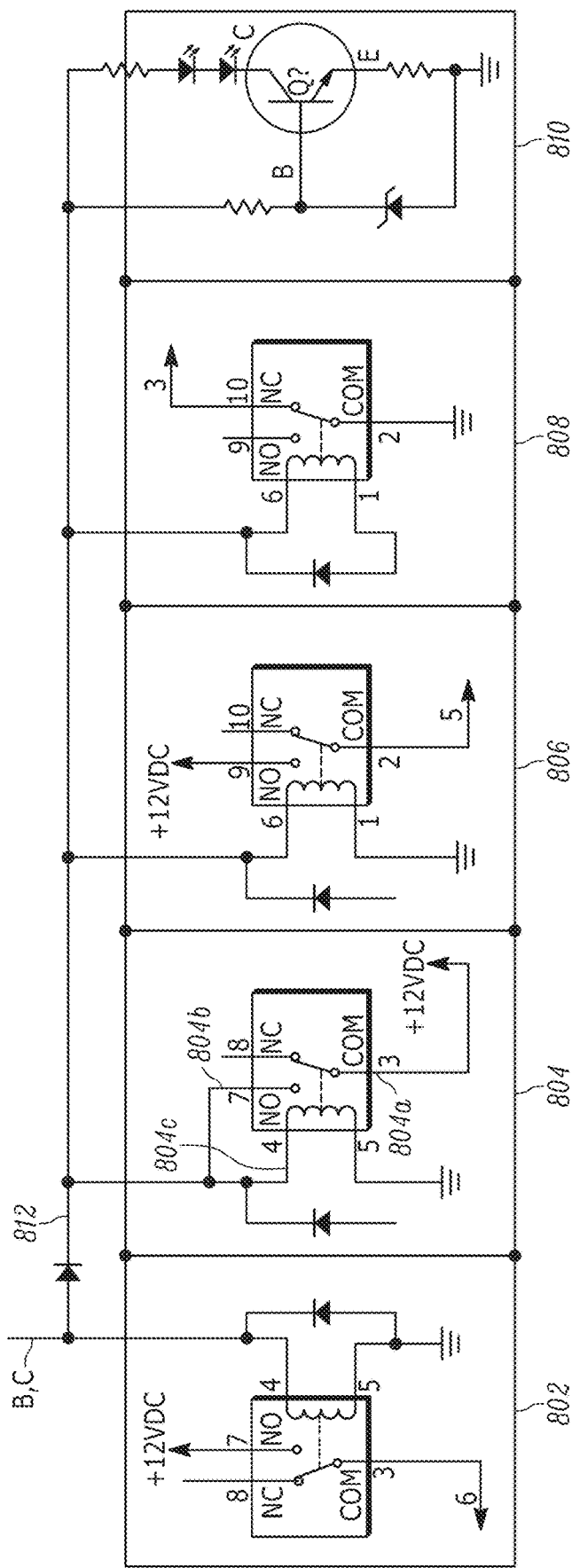
FIG. 16 is an electric schematic diagram of run operation components.

In FIG. 13, a method 700 of initiating the run operation 800 (see FIG. 16) is illustrated. The schematics of FIGS. 14 and 15 are continued in FIG. 16, as denoted by the lines B and C, respectively. At 702, responsive to the user actuating the start button 14, a voltage (e.g., 12V) is supplied to a coil in a start relay 802, which provides power to a start output 812. At 704, power is provided to a coil of a latch relay 804, wherein the start output 812 comprises a pathway that provides power to the coil of the latch relay 804 from the start relay 802. When a voltage (e.g., 12V) is provided to the latch relay 804, the latch closes. Responsive to the latch closing, the voltage travels to a first pin 804*a* and travels out of a second pin 804*b* of the latch relay. The power coming out of the second pin 804*b*, powers a third pin 804*c* of the latch relay 804. In this way, even if the power from the start relay 802 is cut off, the latch relay 804 remains energized. The latch relay 804 provides power to the rest of the circuit and additional relays 806, 808, 810. For example, the latch relay 804 provides voltage to an accessory relay (ACC relay) 806. The ACC relay 806 is latched in the on position, as is a magnetic (MAG) relay 808 responsive to being provided with the voltage from the latch relay 804 and/or the start output 812. A transistor and LEDs 810 are likewise provided with a voltage to illuminate and thus, indicate that the system is enabled or engaged.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The disclosure is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art. In one non-limiting embodiment the terms are defined to be within for example 10%, in another possible embodiment within 5%, in another possible embodiment within 1%, and in another possible embodiment within 0.5%. The term "coupled" as used herein is defined as connected or in contact either temporarily or permanently, although not necessarily directly and not necessarily mechanically. A device or structure that is "configured" in a certain way is configured in at least that way, but may also be configured in ways that are not listed.

To the extent that the materials for any of the foregoing embodiments or components thereof are not specified, it is to be appreciated that suitable materials would be known by one of ordinary skill in the art for the intended purposes. The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A multi-function key system comprising:
  a key identification system in communication with an item of power equipment, the key identification system comprising:
    a first sensor for detecting the presence of a magnetic field; and
    a second sensor for detecting magnetic fields;
  a first key configured to interact with the key identification system, the first key comprising a first magnet generating a first magnetic field; and
  a second key configured to interact with the key identification system, the second key comprising a second magnet generating a second magnetic field, wherein the first and second sensors differentiate between the first and second key based upon the first and second magnetic fields, and wherein the key identification system provides power to a start button when at least one of the first and second key is detected, and initiates a first functionality of the power equipment responsive to identifying the first key and to the start button being actuated, and initiates a second functionality of the power equipment responsive to identifying the second key and to the start button being actuated.

2. The multi-function key system of claim 1, wherein the first sensor comprises a magnetic reed switch and the second sensor comprises a Hall Effect sensor.

3. The multi-function key system of claim 2, wherein the first magnet comprises a first orientation that generates a magnetic flux in a first direction and the second magnet comprises a second orientation that generates a magnetic flux in a second direction, the second direction different than said first direction.

4. The multi-function key system of claim 3, wherein the first magnet has a north pole at a first end of the first magnet and a south pole at a second end of the first magnet, wherein the key supports the first magnet when inserted into a key hole of the key identification system such that the first and second ends of the first magnet extend along a first axis that is parallel to a second axis, wherein the second sensor is positioned along the second axis.

5. The multi-function key system of claim 3, wherein the second magnet has a north pole at a second end of the second magnet and a south pole at a first end of the second magnet, wherein the key supports the second magnet when inserted into a key hole of the key identification system such that the first and second ends of the second magnet extend along a first axis that is parallel to a second axis, wherein the second sensor is positioned along the second axis.

6. The multi-function key system of claim 1, wherein the first sensor comprises a magnetic reed switch and the second sensor comprises a magnetic reed switch.

7. The multi-function key system of claim 6, wherein the first magnet comprises a single magnet present on the first key and is configured to interact with the first sensor but not the second sensor, and the second key comprises the second magnet and a third magnet, the second magnet configured to interact with the first sensor and the third magnet configured to interact with the second sensor.

8. The multi-function key system of claim 3, wherein a magnetic flux of the first magnet interacts with the magnetic read switch to signal a circuit to provide power to the start button and interacts with the Hall Effect sensor to initiate the first functionality.

9. The multi-function key system of claim 3, wherein a magnetic flux of the second magnet interacts with the magnetic read switch to signal a circuit to provide power to the start button and interacts with the Hall Effect sensor to initiate the second functionality.

10. The multi-function key system of claim 6, wherein the first magnet comprises a single magnet present on the first key and is configured to interact solely with the first sensor when inserted into the key hole, and the second key comprises the second magnet and a third magnet, the second magnet configured to interact with the first sensor and the third magnet configured to interact with the second sensor.

11. The multi-function key system of claim 1, wherein the first magnet comprises a first Gauss strength and the second magnet comprises a second Gauss strength wherein the first Gauss strength is between 0.5 mG to about 2.0 mG different than the second Gauss strength.

12. The multi-function key system of claim 1, wherein the first functionality and second functionality comprise at least one of enabling variable speeds, enabling variable speeds via control of a throttle of the engine, different systems or controls, hydraulic pumps, cutting blades, back-hoe functions, fork-lift fork functions, and operable enablement of the power-take-off, wherein the first functionality is different than the second functionality.

13. A method of constructing a multi-function key system, the method comprising the steps of:
  locating a first sensor for detecting the presence of a magnetic field within a sensing proximity of a key hole of a key identification system, the key identification system in communication with an item of power equipment, the first sensor functionally coupled to the key identification system to provide power to a start button when the first sensor detects a magnetic field;
  locating a second sensor for detecting magnetic fields within a sensing proximity of the key hole, the second sensor functionally coupled to the key identification system, wherein the second sensor initiates a first functionality of the power equipment responsive to identifying a magnet with a first magnetic flux direction and to the start button being actuated, and initiates a second functionality of the power equipment responsive to identifying a magnet with a second magnetic flux direction and to the start button being actuated, the first and second magnetic flux directions being different directions;

creating a first key configured to be inserted into the key hole, the first key comprising a first magnet generating a first magnetic field that is oriented in the first magnetic flux direction; and creating a second key configured to be inserted into the key hole, the second key comprising a second magnet generating a second magnetic field that is oriented in the second magnetic flux direction.

14. The method of claim 13, the locating a first sensor comprises locating a magnetic reed switch within the sensing proximity of the key hole of the key identification system.

15. The method of claim 13, the locating a second sensor comprises locating a Hall Effect sensor within the sensing proximity of the key hole of the key identification system.

16. The method of claim 13, configuring:

the first sensor to provide power to the start button and the second sensor to initiate the first functionality responsive to detecting the first magnetic field; and the first sensor to provide power to the start button and the second sensor to initiate the second functionality responsive to detecting the second magnetic field.

17. The method of claim 13, wherein initiates a first functionality comprises enabling at least one of variable speeds, enabling variable speeds via control of a throttle of the engine, different systems or controls, hydraulic pumps, cutting blades, back-hoe functions, fork-lift fork functions, and operable enablement of the power-take-off; and initiates a second functionality comprises enabling at least one of variable speeds, enabling variable speeds via control of a throttle of the engine, different systems or controls, hydraulic pumps, cutting blades, back-hoe functions, fork-lift fork functions, and operable enablement of the power-take-off wherein the first functionality is different than the second functionality.

18. A multi-function key system comprising:

a key identification system in communication with an item of power equipment, the key identification system comprising:

a first sensor for detecting the presence of a magnetic field; and a second sensor for detecting a direction of magnetic fields;

a first key configured to interact with the key identification system, the first key comprising a first magnet comprising a first orientation, the first magnet generating a first magnetic field that generates a magnetic flux in a first direction; and a second key configured to interact with the key identification system, the second key comprising a second magnet, the second magnet comprises a second orientation that generates a magnetic flux in a second direction, the second direction different than said first direction, wherein the first and second sensors differentiate between the first and second key based upon the direction of the first and second magnetic fields, and wherein the key identification system provides power to a start button when at least one of the first and second key is detected by the first sensor, and initiates a first functionality of the power equipment responsive to identifying the first key and to the start button being actuated, and initiates a second functionality of the power equipment responsive to identifying the second key and to the start button being actuated.

19. The multi-function key system of claim 18, wherein the first magnet has a north pole at a first end of the first magnet and a south pole at a second end of the first magnet, wherein the key supports the first magnet when inserted into a key hole of the key identification system such that the first and second ends of the first magnet extend along a first axis that is parallel to a second axis, wherein the second sensor is positioned along the second axis.

20. The multi-function key system of claim 19, wherein the second magnet has a north pole at a second end of the second magnet and a south pole at a first end of the second magnet, wherein the key supports the second magnet when inserted into a key hole of the key identification system such that the first and second ends of the second magnet extend along a first axis that is parallel to a second axis, wherein the second sensor is positioned along the second axis.

* * * * *